(12) United States Patent
Yu et al.

(10) Patent No.: US 11,621,224 B2
(45) Date of Patent: Apr. 4, 2023

(54) CONTACT FEATURES AND METHODS OF FABRICATING THE SAME IN SEMICONDUCTOR DEVICES

(71) Applicant: Taiwan Semiconductor Manufacturing Co., Ltd., Hsin-Chu (TW)

(72) Inventors: Li-Zhen Yu, New Taipei (TW);
Chia-Hao Chang, Hsinchu (TW);
Cheng-Chi Chuang, New Taipei (TW);
Yu-Ming Lin, Hsinchu (TW);
Chih-Hao Wang, Hsinchu County (TW)

(73) Assignee: TAIWAN SEMICONDUCTOR MANUFACTURING CO. LTD., Hsinchu (TW)

( * ) Notice: Subject to any disclaimer, the term of this patent is extended or adjusted under 35 U.S.C. 154(b) by 266 days.

(21) Appl. No.: 16/583,697

(22) Filed: Sep. 26, 2019

(65) Prior Publication Data
US 2021/0098364 A1 Apr. 1, 2021

(51) Int. Cl.
| *H01L 23/522* | (2006.01) |
| *H01L 27/088* | (2006.01) |
| *H01L 21/8234* | (2006.01) |
| *H01L 23/528* | (2006.01) |
| *H01L 21/768* | (2006.01) |

(52) U.S. Cl.
CPC .... *H01L 23/5226* (2013.01); *H01L 21/76816* (2013.01); *H01L 21/823418* (2013.01); *H01L 21/823431* (2013.01); *H01L 21/823468* (2013.01); *H01L 21/823475* (2013.01); *H01L 23/5283* (2013.01); *H01L 27/0886* (2013.01)

(58) Field of Classification Search
CPC ....... H01L 21/76816; H01L 21/823418; H01L 21/823431; H01L 21/823468; H01L 21/823475; H01L 27/0886; H01L 23/5226; H01L 23/5283
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,796,666 | B1 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,860,148 | B2 | 10/2014 | Hu et al. |
| 8,962,400 | B2 | 2/2015 | Tsai et al. |

(Continued)

*Primary Examiner* — Daniel Whalen
(74) *Attorney, Agent, or Firm* — Haynes and Boone, LLP

(57) ABSTRACT

A semiconductor structure includes a metal gate structure (MG) disposed over a semiconductor substrate, gate spacers disposed on sidewalls of the MG, and a gate contact disposed on the MG. The semiconductor structure further includes an etch-stop layer (ESL) disposed on the gate spacers, and a source/drain (S/D) contact disposed adjacent to the gate spacers, where a top portion of the S/D contact defined by the ESL is narrower than a bottom portion of the S/D contact defined by the gate spacers.

20 Claims, 17 Drawing Sheets

(56) References Cited

U.S. PATENT DOCUMENTS

| | | | |
|---|---|---|---|
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2017/0053804 A1* | 2/2017 | Lu | H01L 21/28088 |
| 2017/0062339 A1* | 3/2017 | Hsu | H01L 23/485 |
| 2017/0186849 A1* | 6/2017 | Chen | H01L 21/76829 |

\* cited by examiner

CONTACT FEATURES AND METHODS OF FABRICATING THE SAME IN SEMICONDUCTOR DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication of vertical interconnects becomes more challenging as feature sizes continue to decrease. In one example, separation distance between a metal gate contact and an adjacent source/drain contact may suffer shrinkage when overall feature sizes are reduced. For this and other reasons, improvements in methods of forming such features in ICs are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
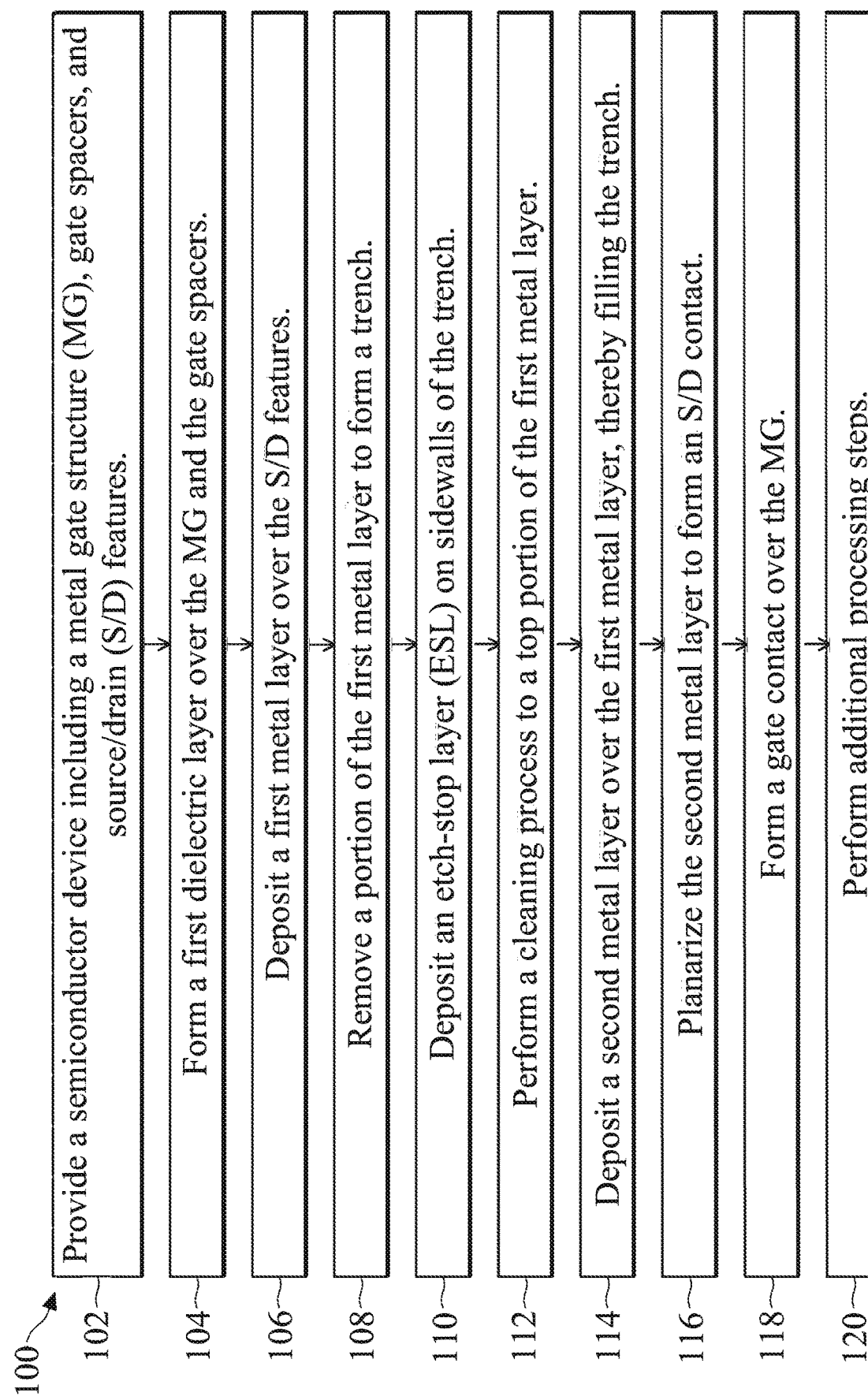
FIG. 1 shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-like FETs (FinFETs). It is an objective of the present disclosure to provide vertical interconnect features (e.g., via contact features) for connecting device-level contact features (e.g., source/drain contacts, metal gate stacks, etc.) with additional interconnect features in semiconductor devices.

In FET fabrication, lithography patterning processes are typically implemented to form a contact trench (or a contact hole) over a device-level feature (e.g., a metal gate stack, a source/drain feature, etc.) before depositing a conductive material in the contact trench to form a metal gate contact or a source/drain (S/D) contact. Generally, dielectric features such as gate spacers are provided between the metal gate contact and a neighboring S/D contact to prevent shorting during device operation. However, as device sizes continue to decrease, separation distance between adjacent metal gate contact and S/D contact also shrinks to values approaching the processing limit of lithography instruments, thereby reducing the margin of error allowed for the lithography patterning processes. In some instances, potential overlay errors associated with the lithography processes may inadvertently cause the metal gate contact to shift toward the S/D contact, thereby reducing the separation distance even further and risking potential shorting between the contact features. For these and other reasons, it is desirable to improve methods for forming metal gate contact, particularly for ensuring sufficient separation distance between the metal gate contact and the adjacent S/D contact during FET fabrication processes.

Figure 2:
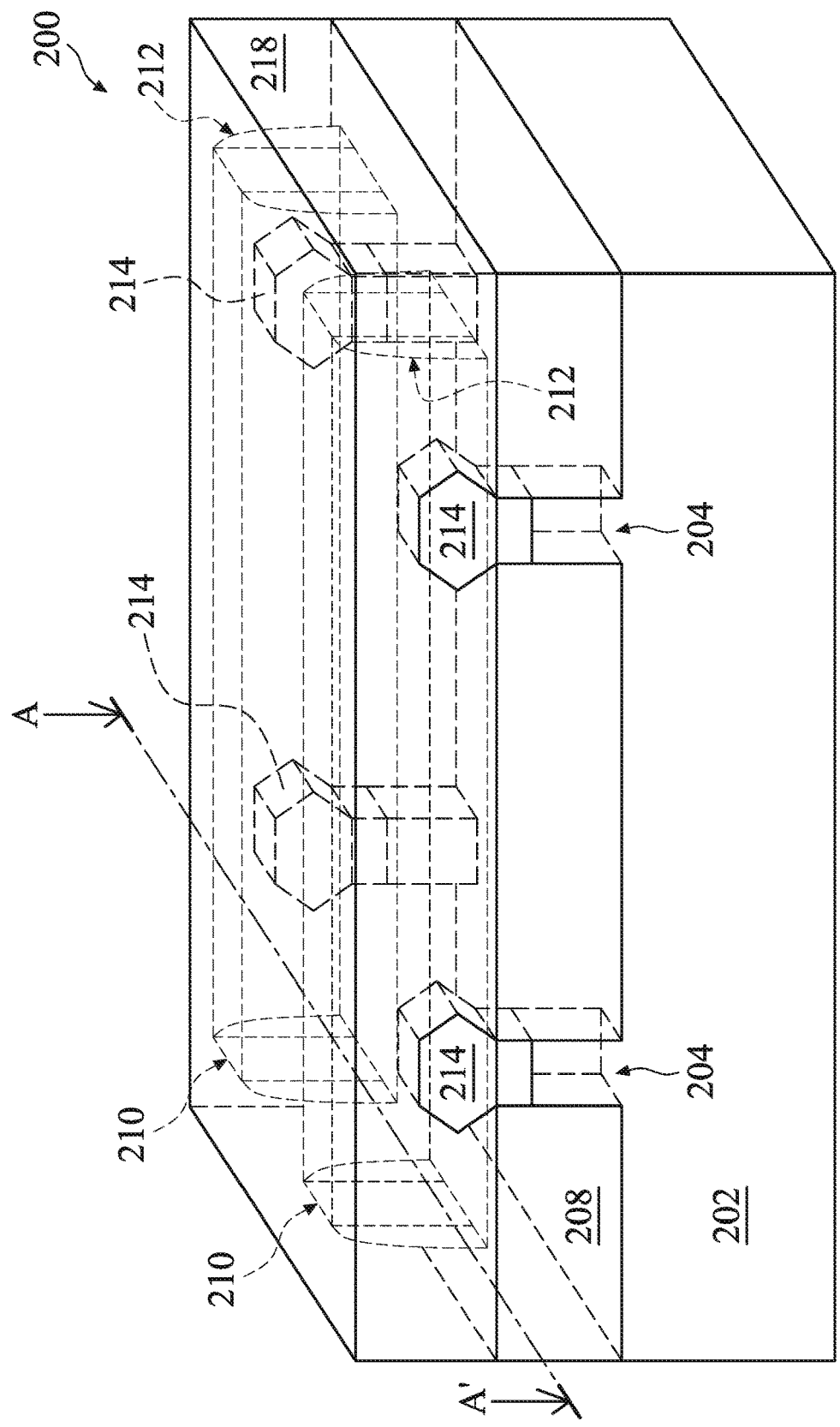
FIG. 2 is a perspective three-dimensional view of an embodiment of a semiconductor device according to various aspects of the present disclosure.

FIG. 1 illustrates an embodiment of a method 100 for forming a semiconductor device 200 according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2-16C, which illustrate a portion of the semiconductor device 200 during intermediate steps of the method 100. FIGS. 3-16C are cross-sectional views of the device 200 taken along dashed line AA' as illustrated in FIG. 2. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 3:
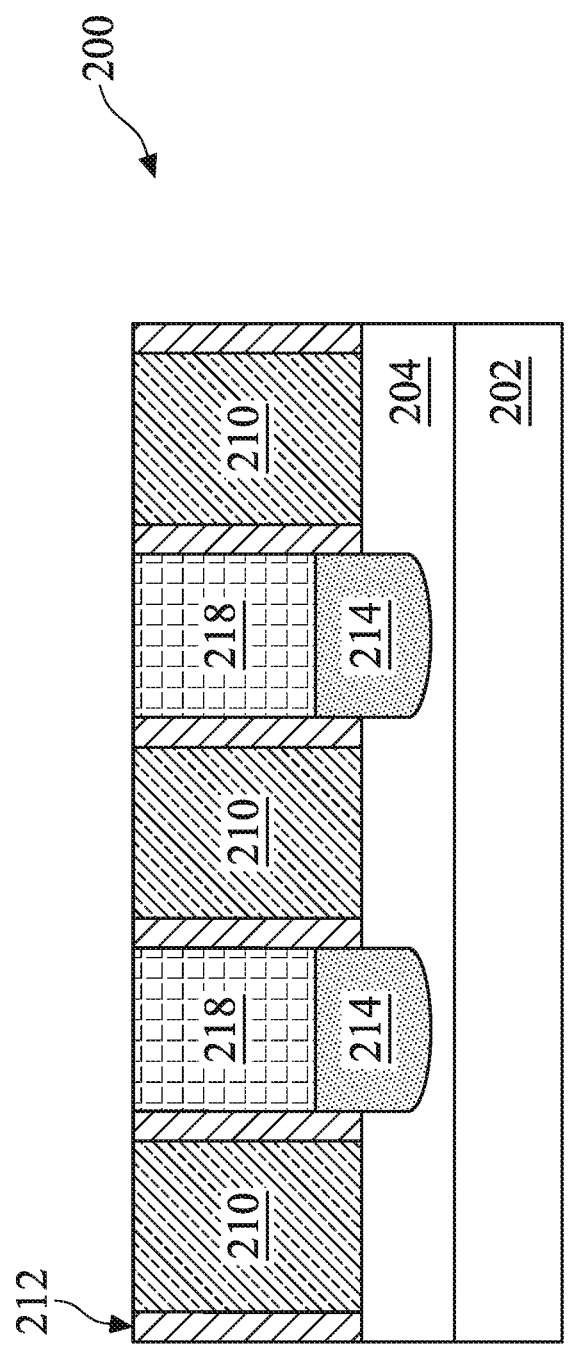
FIGS. 3, 4, 5, 6, 7, 8, 9, 10, 11, 12A, 12B, 13, 14A, 14B, 15A, 15B, 15C, 15D, 16A, 16B, and 16C are cross-sectional views of an embodiment of the semiconductor device of FIG. 2 along line AA' during intermediate steps of an embodiment of the method of FIGS. 1A and 1B according to various aspects of the present disclosure.

At operation 102, referring to FIGS. 2 and 3, the method 100 provides a device 200 including a substrate 202 having a three-dimensional active region 204 (hereafter referred to as fin 204) disposed thereover. The device 200 further includes a high-k metal gate (HKMG) structure 210 disposed over the fin 204, gate spacers 212 disposed on sidewalls of the HKMG structure 210, source/drain (S/D) features 214 disposed over the fin 204, isolation structures 208 disposed over the substrate 202 separating various components of the device 200, and an interlayer dielectric (ILD) layer 218 disposed over the isolation structures 208 and the S/D features 214. As depicted in FIG. 2, two fins 204 are present in the device 200. For purposes of clarity, however, methods of the present disclosure will be discussed with reference to one of the two fins 204; of course, the present disclosure is equally applicable to the other one of the two fins 204.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 2 and 3, the fins 204 may be suitable for forming a p-type or an n-type FinFET. The fin 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization/polishing (CMP) process. Other isolation structures such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2 and 3, the device 200 includes S/D features 214 disposed over the fins 204, each being disposed adjacent to the HKMG structure 210. The S/D features 214 may be formed by any suitable techniques, such as etching processes followed by one or more epitaxial growth processes. In one example, one or more etching processes are performed to remove portions of the fins 204 to form recesses (not shown) therein. A cleaning process may be performed to clean the recesses with a hydrofluoric acid (HF) solution or other suitable solution. Subsequently, one or more epitaxial growth processes are performed to grow epitaxial S/D features in the recesses. Each of the S/D features 214 may be suitable for forming a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe) doped with a p-type dopant such as boron, germanium, indium, and/or other p-type dopants. The n-type epitaxial material may include one or more epitaxial layers of silicon (epi Si) or silicon carbon (epi SiC) doped with an n-type dopant such as arsenic, phosphorus, and/or other n-type dopant.

The device 200 further includes the HKMG structure 210 disposed over a portion of the fins 204, such that it interposes S/D features 214. The HKMG structure 210 includes a high-k dielectric layer (i.e., having a dielectric constant greater than that of silicon oxide, which is about 3.9; not depicted) disposed over the fins 204 and a metal gate electrode (not depicted) disposed over the high-k dielectric layer. The metal gate electrode may further include at least one work function metal layer disposed over the high-k dielectric layer and a bulk conductive layer disposed thereover. The work function metal layer may be a p-type or an n-type work function metal layer. Example work function materials include TiN, TaN, WN, $ZrSi_2$, $MoSi_2$, $TaSi_2$, $NiSi_2$, Ti, TaAl, TaAlC, TiAlN, TaC, TaCN, TaSiN, other suitable work function materials, or combinations thereof. The bulk conductive layer may include copper (Cu), tungsten (W), aluminum (Al), cobalt (Co), other suitable materials, or combinations thereof. The HKMG structure 210 may further include numerous other layers (not depicted), such as an interfacial layer disposed between the fins 204 and the high-k dielectric layer, hard mask layers, capping layers, barrier layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof. A polishing process, such as a CMP process, may be performed to remove excess materials from a top surface of the HKMG structure 210 to planarize a top surface of the device 200.

The device 200 further includes gate spacers 212 disposed on sidewalls of the HKMG structure 210. The gate spacers 212 may include a dielectric material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride, zirconium nitride, silicon carbonitride, etc.), a silicon-containing material (e.g., hafnium silicide, silicon, zirconium silicide, etc.), other suitable materials, or combinations thereof. The gate spacers 212 may be a single layered structure or a multi-layered structure. Notably, the composition of the gate spacers 212 is distinct from that of the surrounding dielectric components, such that an etching selectivity may exist between the gate spacers 212 and the surrounding dielectric components during subsequent etching processes. The gate spacers 212 may be formed by first depositing a blanket of spacer material over the device 200, and then performing an anisotropic etching process to remove portions of the spacer material to form the gate spacers 212 on sidewalls of the dummy gate structure.

In some embodiments, the HKMG structure 210 is formed after other components of the device 200 (e.g., the S/D features 214) are fabricated. Such process is generally referred to as a gate replacement process, which includes forming a dummy gate structure (not depicted) as a placeholder for the HKMG structure 210, forming the S/D features 214, forming the ILD layer 218 (and optionally a contact etch-stop layer, or CESL) over the dummy gate structure and the S/D features 214, planarizing the ILD layer 218 by, for example, CMP, to expose a top surface of the dummy gate structure, removing the dummy gate structure in the ILD layer 218 to form a trench that exposes a channel region of the fins 204, and forming the HKMG structure 210 in the trench to complete the gate replacement process. In some embodiments, the ILD layer 218 includes a dielectric material, such as tetraethylorthosilicate (TEOS), silicon oxide, a low-k dielectric material, doped silicon oxide such as borophosphosilicate glass (BPSG), phosphosilicate glass (PSG), FSG, boron doped silicate glass (BSG), other suitable dielectric materials, or combinations thereof. The ILD layer 218 may include a multi-layer structure having multiple dielectric materials and may be formed by a deposition process such as, for example, CVD, FCVD, SOG, other suitable methods, or combinations thereof. The CESL may comprise silicon nitride, silicon oxynitride, silicon nitride with oxygen or carbon elements, other suitable materials, or combinations thereof, and may be formed by CVD, PVD, ALD, other suitable methods, or combinations thereof.

Figure 4:
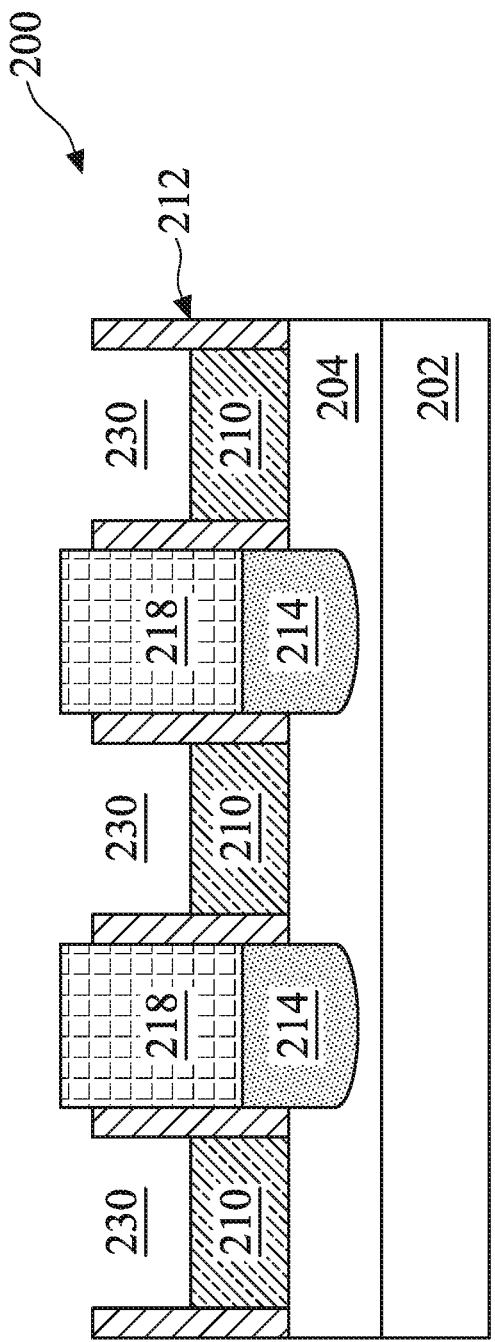
Figure 5:
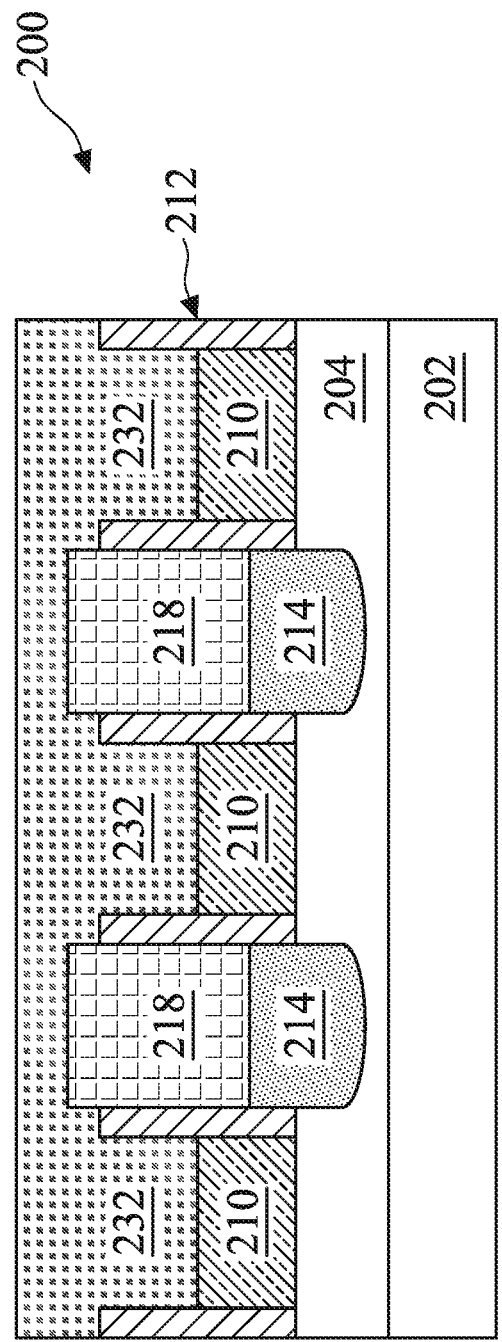
Figure 6:
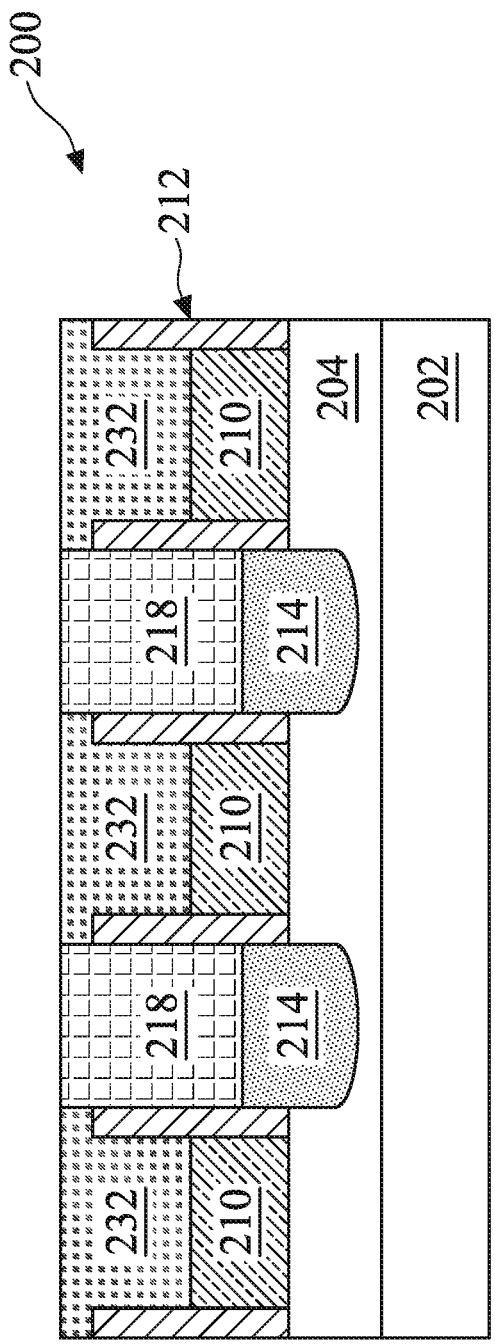

Referring to FIGS. 4-6, the method 100 at operation 104 forms a dielectric layer 232 over the HKMG structures 210. Referring to FIG. 4, the method 100 first removes portions of the HKMG structures 210 to form trenches 230. In some embodiments, the method 100 performs an etching process, such as a dry etching process, to form the trenches 230. The etching process selectively removes the HKMG structures 210 with respect to the ILD layer 218, such that the ILD layer 218 is not etched or not substantially etched. In some examples, as depicted herein, top portions of the gate spacers 212 may be removed during operation 104.

Referring to FIGS. 5-6, the method 100 then forms the dielectric layer 232 in the trenches 230. In the present embodiments, referring to FIG. 5, the method 100 deposits a dielectric material by a suitable method, such as CVD, ALD, FCVD, PVD, other suitable methods, or combinations thereof. The dielectric layer 232 may include any suitable material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride, zirconium nitride, silicon carbonitride, etc.), a silicon-containing material (e.g., hafnium silicide, silicon, zirconium silicide, etc.), other suitable materials, or combinations thereof. Thereafter, referring to FIG. 6, the method 100 planarizes a top surface of the device 200 using a suitable method such as CMP to expose a top surface of the ILD layer 218. As such, each portion of the dielectric layer 232 disposed over the HKMG structure 210 is configured to have a "T" shape, a top portion of which is disposed over the gate spacers 212. In other words, the dielectric layer 232 is self-aligned with gate spacers 212. In some embodiments, the method 100 omits forming the dielectric layer 232 and proceeds from operation 102 to operation 106 directly.

Figure 7:
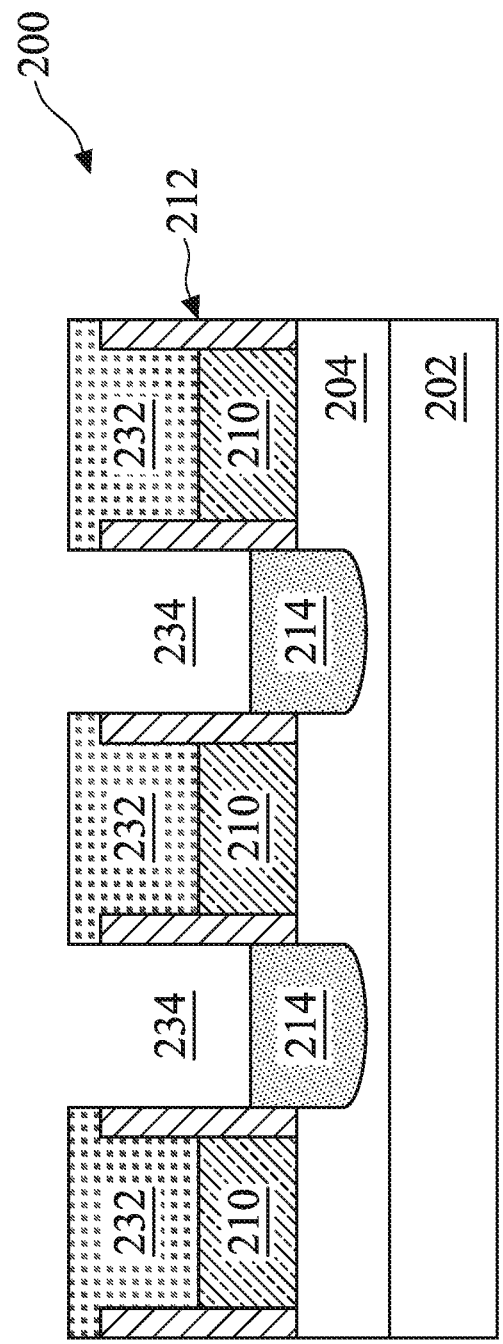
Figure 8:
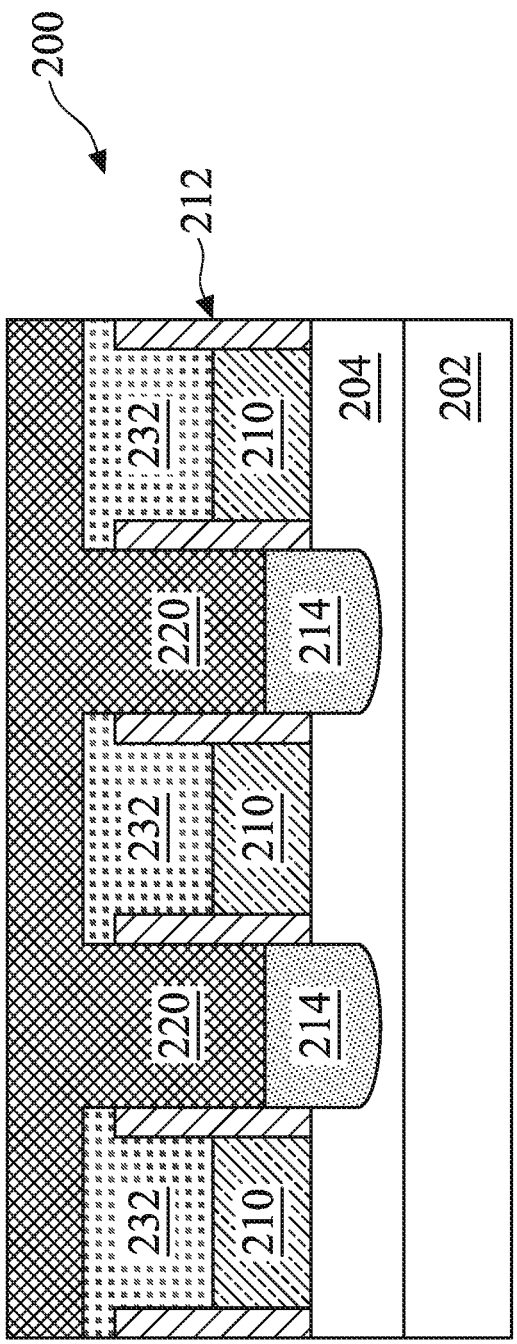
Figure 9:
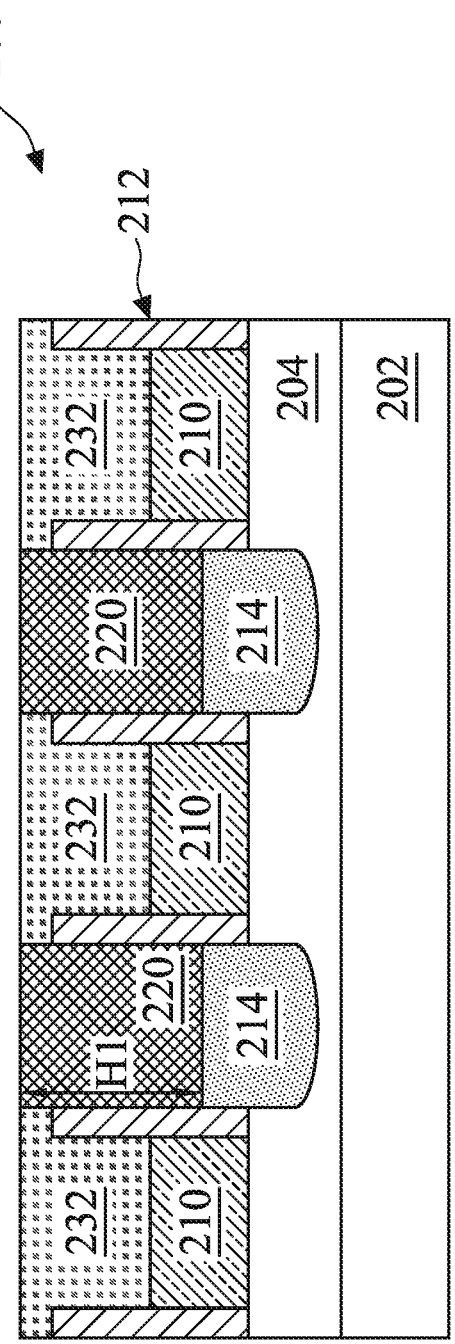

Referring to FIGS. 7-9, the method 100 at operation 106 forms a conductive layer 220 over the S/D features 214. Referring to FIG. 7, the method 100 removes portions of the ILD layer 218 disposed over the S/D features 214 to form trenches 234. The method 100 may implement any suitable etching process (e.g., dry etching, wet etching, and/or RIE) to form the trenches 234. In some embodiments, the etching process is a dry etching process that employs one or more etchant, such as a fluorine-containing gas (e.g., $C_4F_6$, $CF_4$, $SF_6$, $CH_2F_2$, $CHF_3$, and/or $C_2F_6$), oxygen, hydrogen, other suitable gases, or combinations thereof. In the depicted embodiment, the etching process employs a mixture of $C_4F_6$, oxygen, and hydrogen as an etchant.

Subsequently, the method 100 may form a silicide layer (not depicted) over the S/D features 214. In some embodiments, the silicide layer includes a metal silicide, such as nickel silicide, cobalt silicide, tungsten silicide, tantalum silicide, titanium silicide, platinum silicide, erbium silicide, palladium silicide, other suitable silicides, or combinations thereof. The silicide layer may be formed by a deposition process such as CVD, ALD, PVD, other suitable processes, or combinations thereof. For example, a metal layer (e.g., nickel) may be deposited over the S/D features 214. Then, the device 200 is annealed to allow the metal layer and the semiconductor materials of the S/D features 214 to react. Thereafter, the un-reacted metal layer is removed, leaving the silicide layer over the S/D features 214. Alternatively, the silicide layer may be directly formed over the S/D features 214 by any suitable deposition method, such as CVD, ALD, PVD, other suitable methods, or combinations thereof.

Referring to FIG. 8, the method 100 then deposits a conductive layer 220 in the trenches 234 and over portions of the dielectric layer 232. The conductive layer 220 may include any suitable material, such as W, Co, Ru, Cu, Ta, Ti, Al, Mo, other suitable conductive materials, or combinations thereof. The conductive layer 220 may be deposited by any suitable method, such as CVD, PVD, ALD, plating, other suitable methods, or combinations thereof. In some embodiments, depending upon a specific choice of material, the method 100 first forms a barrier layer (not depicted) in the trenches 234 before depositing the conductive layer 220 to prevent any diffusion of the conductive layer 220. Thereafter, referring to FIG. 9, the method 100 planarizes the top surface of the device 200 using a suitable method such as CMP to form the conductive layer 220 over the S/D features 214. In some embodiments, portions of the conductive layer 220 formed over the dielectric layer 232 are removed by the CMP process, such that a top surface of the conductive layer 220 are substantially planar with a top surface of the dielectric layer 232.

Figure 10:
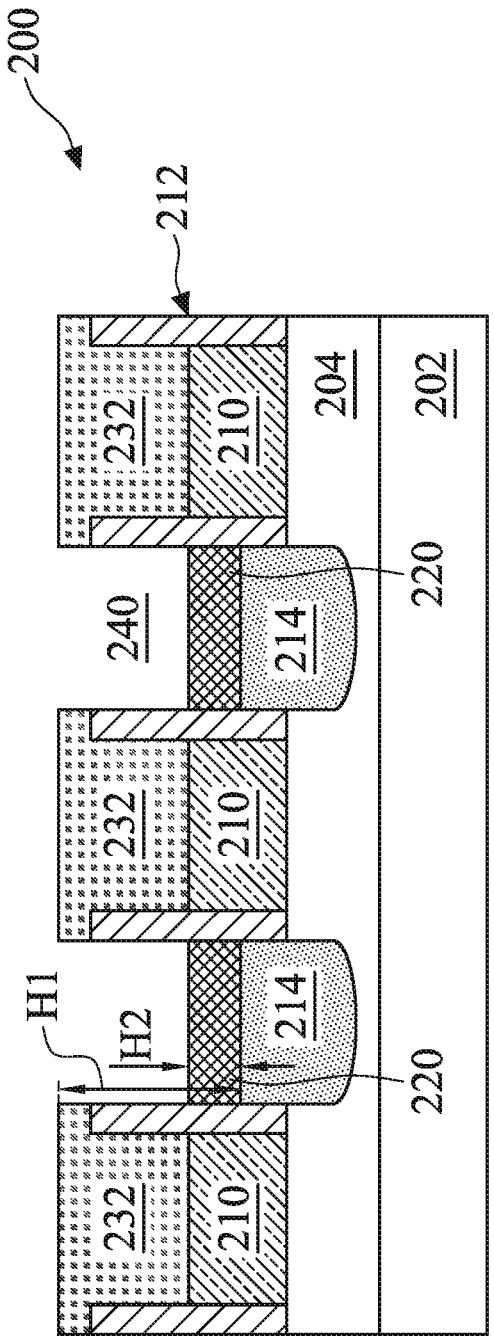

Referring to FIG. 10, the method 100 at operation 108 removes a portion of the conductive layer 220 to form trenches 240. In the present embodiments, the method 100 forms the trenches 240 by implementing alternating cycles of oxidation and etching processes. In some embodiments, the conductive layer 220 is exposed to a chemical agent such as sulfuric acid ($H_2SO_4$), which is configured to oxidize a top portion of the conductive layer 220. Subsequently, the conductive layer 220 is exposed to an etchant such as diluted hydrofluoric acid (DHF), diluted ozone ($O_3$), and/or other suitable etchants configured to remove the oxidized top portion from the conductive layer 220. In some embodiments, the method 100 repeats operation 108 until a desired amount of the conductive layer 220 remains over the S/D features 214. Notably, the present disclosure does not limit the amount of the conductive layer 220 to be removed so long as a height H2 of the conductive layer 220 is greater than 0 nm after performing operation 108, i.e., the conductive layer 220 is not completely removed by operation 108. In the present embodiments, H2 is about 5% to about 95% of a height H1 of the conductive layer 220 (depicted in FIG. 9). Considering the processing variations of the etching process, if H2 is targeted to be less than about 5% of H1, it is possible to fully remove the conductive layer 220 and the subsequently-formed etch-stop layer (ESL; e.g., ESL 242) in the trenches 240 may contact the top surface of the S/D features 214, thereby limiting the contact area between the resulting S/D contact and the S/D features 214. On the other hand, if H2 is targeted to be more than about 95% of H1, it is possible that not enough amount of the conductive layer 220 is removed to accommodate subsequent formation of layers in the trenches 240.

Figure 11:
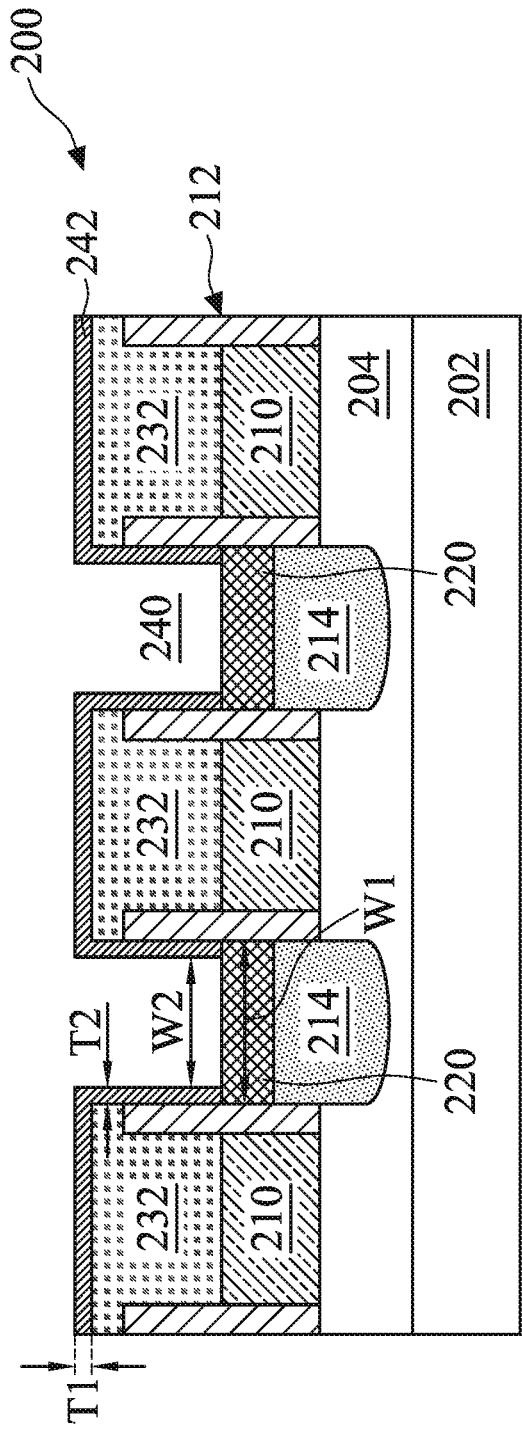

Referring to FIG. 11, the method 100 at operation 110 deposits an ESL 242 over the device 200. Notably, the ESL 242 is selectively deposited on dielectric components of the device 200, i.e., on the gate spacers 212 and the dielectric layer 232. In other words, the ESL 242 chemically grows on surfaces of the exposed dielectric materials of the device 200 but not, or not substantially, on surfaces of the conductive layer 220, which includes a metal. In some embodiments, the method 100 deposits the ESL 242 in an ALD process during which precursors for forming the ESL 242 are applied in a cyclic fashion and the resulting ESL 242 selectively forms on dielectric components of the device 200. In the present embodiments, dimensions of the ESL 242 may be controlled by tuning the number of deposition cycles performed in a deposition chamber during an ALD process. The ESL 242 may include any suitable material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride, zirconium nitride, silicon carbonitride, etc.), a silicon-containing material (e.g., hafnium silicide, silicon, zirconium silicide, etc.), other suitable materials, or combinations thereof. Notably, the composition of the ESL 242 is chosen to be distinctly different from the composition of the dielectric layer 232 and the gate spacers 212, ensuring sufficient etching selectivity between said layers during subsequent processing steps. In one such example, the ESL 242, the dielectric layer 232, and the gate spacers 212 may include an aluminum-containing material (e.g., aluminum oxide), a nitrogen-containing material (e.g., silicon nitride), and a carbon-containing material (e.g., silicon oxycarbide), respectively.

In some embodiments, the dimension of the ESL 242 may be characterized by a thickness T1 of portions formed over the dielectric layer 232 and a thickness T2 of portions formed on sidewalls of the trenches 240. Notably, T1 may be different from T2 due to differences in kinetics of the precursor gas molecules when they arrive at different surfaces (e.g., on a horizontal surface such as the dielectric layer 232 or on a vertical sidewall surface in the trenches 240) during the deposition process. In some embodiments, T1 is greater than T2, and a ratio of T2 to T1 is about 1:5 to about 3:5. In further embodiments, as temperature and/or pressure of the deposition chamber decreases, a ratio of T2 to T1 decreases. In some examples, T1 may be about 5 nm to about 10 nm and T2 is about 2 nm to about 3 nm; of course, the present embodiments are not limited to these dimensions.

Still referring to FIG. 11, after depositing the ESL 242, a top portion of the trenches 240 is defined by a width W2, which is the difference of a width W1 of the conductive layer 220 and twice of T2 as illustrated herein. In other words, W2=W1−2*T2. In some embodiments, W2 is at least 0.5 times of W1, such that a sufficient opening in each of the trenches 240 remains to accommodate the subsequent formation of a conductive layer 224 (shown in FIG. 13 and discussed below) over the conductive layer 220. If W2 is less than about 0.5 times of W1, the contact area between the subsequently-formed S/D contact and via contact feature thereover would be reduced, thereby compromising or degrading the overall performance of the device 200. In some examples, W1 is about 15 nm to about 20 nm. Accordingly, the presence of the ESL 242 enlarges a separation distance between the subsequently-formed conductive layer 224 (as a portion of an S/D contact) and an adjacent gate contact subsequently formed over the HKMG structure 210, thereby providing a greater window of isolation between the gate contact and the S/D contact should any unintentional errors (e.g., lithographic overlay error) occur when forming the gate contact.

Figure 12A:
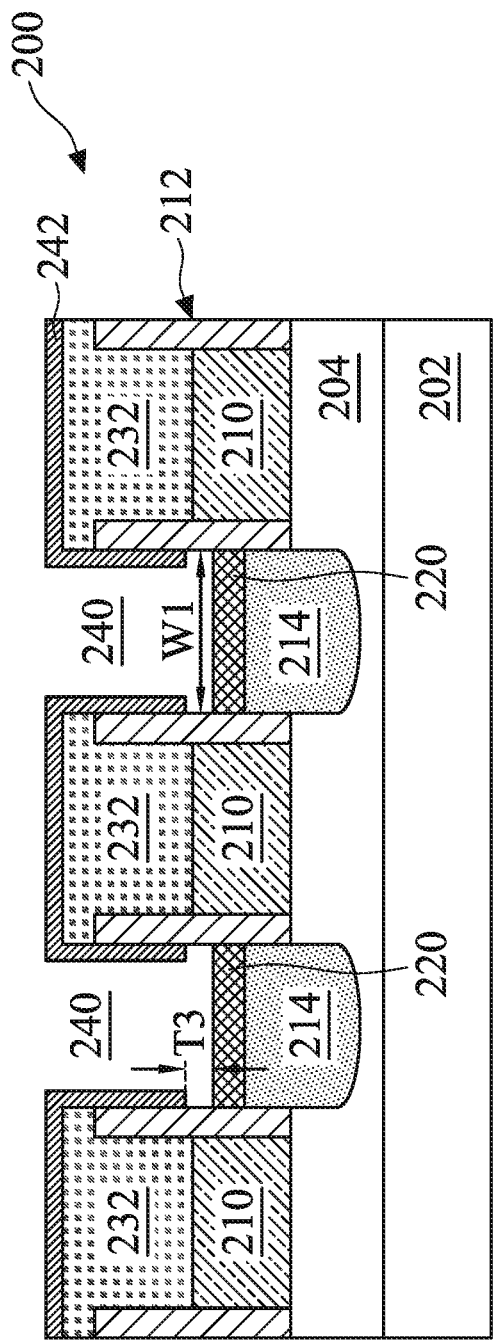
Figure 12B:
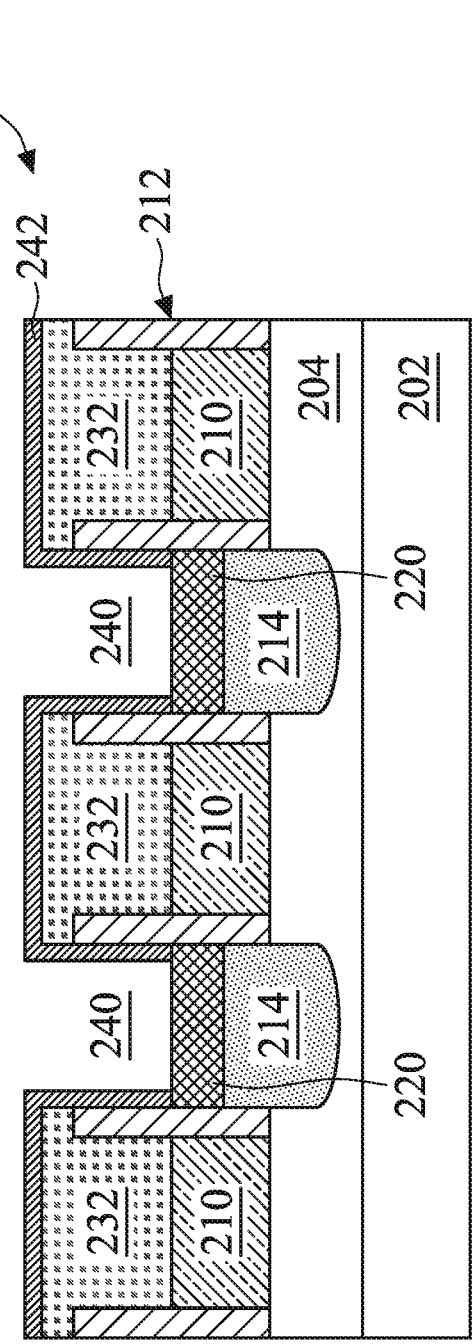

Referring to FIGS. 12A and 12B, the method 100 at operation 112 performs a cleaning process to a top surface of the conductive layer 220, thereby removing any oxide layer that may negatively affect the contact resistance of the conductive layer 220. In some examples, the method 100 removes any native metal oxide layer at the top surface of the conductive layers 220 using a suitable etchant such as a fluorine-based gas (e.g., $CF_4$, $WF_6$), an inert gas (e.g., Ar, He), and/or other suitable gases in a dry etchant process. In some examples, the removal of the oxide layer may be tuned by adjusting the flow rate of the etchant to be about 4 sccm to about 200 sccm, chamber pressure to be about 1 mTorr to about 100 mTorr, and power of plasma to be about 50 W to about 250 W; of course, the present embodiments are not limited to these processing conditions.

In some embodiments, as illustrated in FIG. 12A, the method 100 proceeds to removing a top portion of the conductive layer 220 while leaving the ESL 242 substantially in place. In other words, a separation distance T3 between the bottom portion of the ESL 242 in the trenches 240 and the top surface of the conductive layer 220 is greater than 0. The present disclosure does not limit the specific dimension of T3 so long as it does not completely extend to the S/D features 214 such that the ESL 242 is in contact with the S/D features 214, which would inadvertently reduce the contact area (and increase contact resistance) between the subsequently-formed conductive layer 224 and the S/D features 214. Stated differently, T3 is less than a difference between H1 and H2 (see FIG. 10). In some examples, T3 is less than about 50 nm but greater than 0. Stated in a different way, the method 100 at operation 112 extends the trenches 240 vertically toward the substrate 202 and laterally across the width W1 of the conductive layer 220, thereby transforming the trenches 240 to an upside-down T-shaped configuration. The upside-down T-shaped configuration enlarges a contact area between the conductive layer 220 and a subsequently-formed conductive layer thereover (e.g., conductive layer 224), thereby lowering contact resistance between the S/D contact and the S/D features 214.

In the present embodiments, the method 100 removes the top portion of the conductive layer 220 in a process similar to that discussed above with respect to operation 108. Briefly, the method 100 performs a series of oxidation and etching processes in a cyclic fashion, such that each cycle is configured to remove a portion of the conductive layer 220. The value of T3 may be determined by the number of cycles performed by the method 100. Notably, removing the top portion of the conductive layer 220 enlarges a contact area between the conductive layer 220 and the subsequently formed conductive (or metal) layer, thereby reducing the contact resistance therebetween for improved device performance. Alternatively, referring to FIG. 12B, the method 100 may omit the etching process after performing the cleaning process at operation 112, such that the bottom portions of the ESL 242 in the trenches 240 are in contact with the top surface of the conductive layer 220. In other words, T3 measures about 0. It is understood that the configurations depicted in FIGS. 12A and 12B are equally applicable during subsequent operations of the method 100. For purposes of clarity, however, the following operations of the method 100 will be discussed in the context of the embodiment depicted in FIG. 12A.

Figure 13:
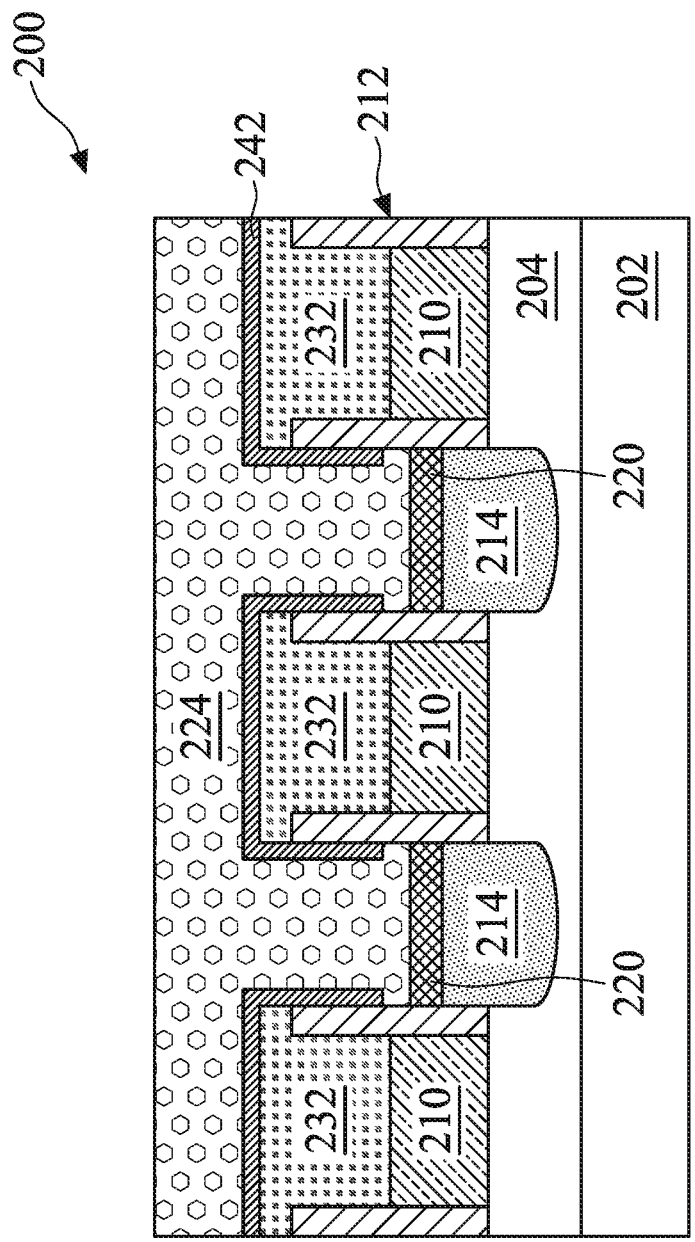

Referring to FIG. 13, the method 100 at operation 114 deposits the conductive layer 224 over the device 200, thereby filling the trenches 240. In the present embodiments, portions of the conductive layer 224 are deposited over a top portion of the ESL 242. In some embodiments, the conductive layer 224 includes W, Co, Ru, Mo, or combinations thereof. In some embodiments, the conductive layer 224 includes a single material in direct contact with the ESL 242. In some embodiments, the conductive layer 224 includes multiple layers. In some embodiments, the conductive layer 224 may be the same as the conductive layer 220 or, alternatively, it may be different from the conductive layer 220. In some embodiments, the conductive layer 224 is free of Cu. Notably, while some embodiments of the conductive layer 220 for forming the conductive layer 220 may involve forming a barrier layer first as discussed above, the conductive layer 224 may be directly deposited over the conductive layer 220 in other embodiments without the need for any barrier layer, thereby reducing the complexity and cost of the overall fabrication process. Furthermore, in some embodiments, composition of the conductive layer 224 may be chosen to have a lower resistivity than the conductive layer 220, such that the overall resistance of the S/D contact (i.e., including both the conductive layers 220 and 224) may be reduced. In some embodiments, the conductive layer 224 is selectively deposited over the conductive layer 220 and not, or not substantially, over the ESL 242 or the gate spacers 212 using any suitable method such as CVD, ALD, plating, or combinations thereof. In other words, the conductive layer 224 is configured to first chemically bond with and/or grow on the conductive layer 220 and then on itself as it is deposited in the trenches 240, such that the conductive layer 224 is formed in a bottom-up growth pattern in the trenches 240. In some examples, the conductive layer 224 may be selectively formed by performing the deposition process in a low-pressure and/or low-temperature environment, such that incubation time for forming the conductive layer 224 may be adjusted to substantially favor certain surfaces (e.g., on the conductive layer 220) but not others (e.g., on the ESL 242 or the gate spacers 212). Notably, if the conductive layer 224 is deposited in a non-selective manner, voids may be formed during the deposition process, thereby introducing defects in the S/D contact that may adversely affect the overall performance of the device 200.

Figure 14A:
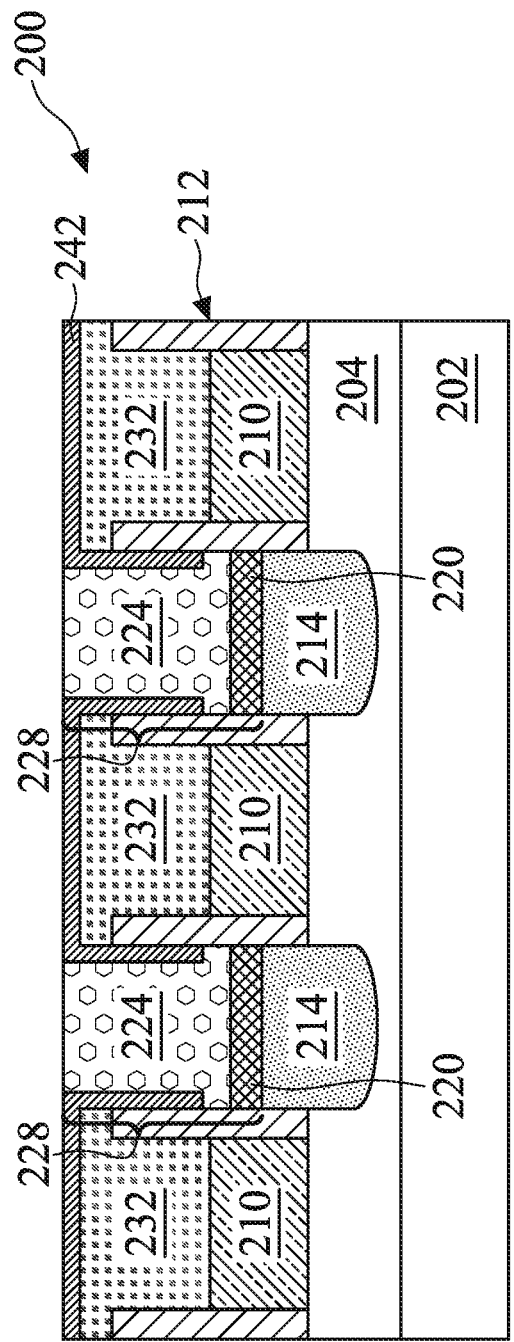
Figure 14B:
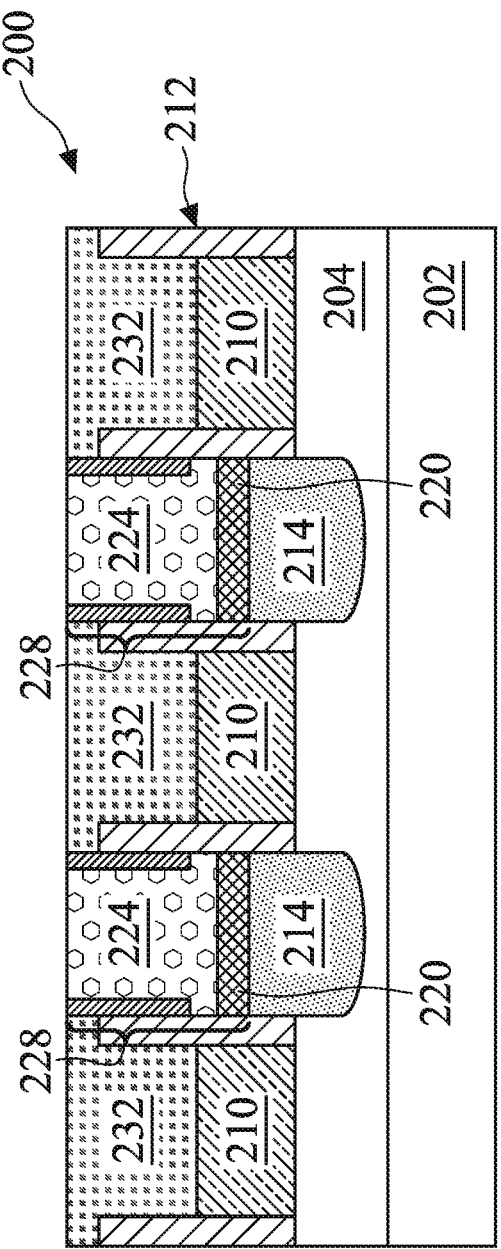

Referring to FIGS. 14A and 14B, the method 100 at operation 116 planarizes the device 200 using, for example, a CMP process to remove portions of the conductive layer 224. Referring to FIG. 14A, the method 100 removes the conductive layer 224 from the top portion of the ESL 242, such that a top surface of the conducive layer 224 is substantially planar with the top portion of the ESL 242. Alternatively, referring to FIG. 14B, the method 100 removes the top portion of the ESL 242, such that the top surface of the conductive layer 224 is substantially planar with the top surface of the dielectric layer 232. In other words, in the present embodiments, the top portion of the ESL 242 may optionally remain in the device 200 or be removed by the planarization process at operation 116. As depicted herein, the conductive layers 220 and 224 together constitute an S/D contact 228, where sidewalls of at least a portion of the conductive layer 224 are defined by the ESL 242. The embodiments depicted in FIGS. 14A and 14B are equally applicable in the present embodiments; however, for purposes of clarity, the following description of the method 100 will be discussed in reference to the embodiment shown in FIG. 14B.

Figure 15A:
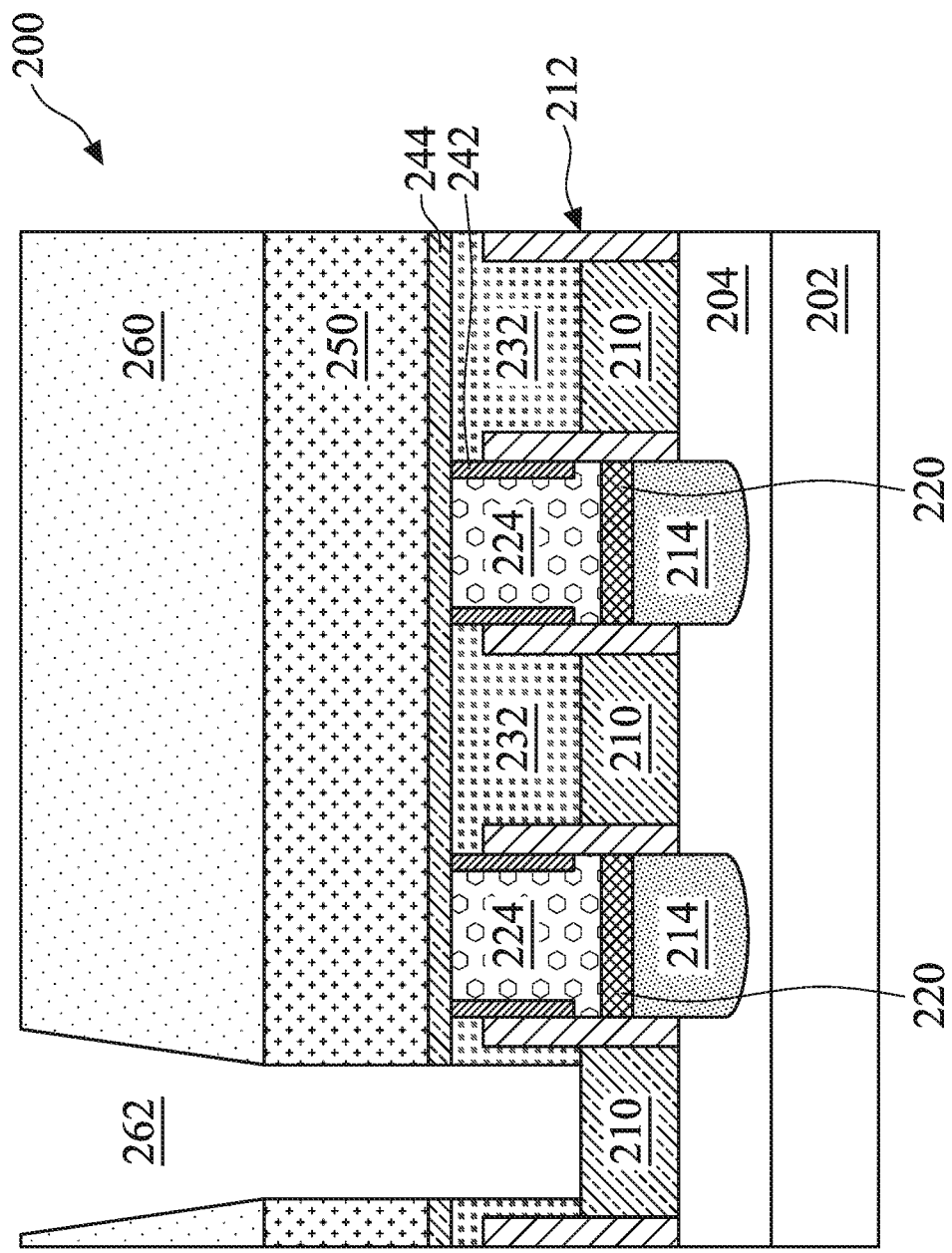

Referring to FIGS. 15A-16C, the method 100 at operation 118 forms a gate contact 272 and a via contact 274 over the HKMG structure 210 and the S/D contact 228, respectively, via a series of patterning and deposition processes. Referring to FIG. 15A, the method 100 first forms an ESL 244 over the device 200 and an ILD layer 250 over the ESL 244 before performing the patterning processes. The ESL 244 may include any suitable material, such as an oxygen-containing material (e.g., silicon oxide, silicon oxycarbide, aluminum oxide, aluminum oxynitride, hafnium oxide, titanium oxide, zirconium aluminum oxide, zinc oxide, tantalum oxide, lanthanum oxide, yttrium oxide, silicon oxycarbonitride, etc.), a nitrogen-containing material (e.g., tantalum carbonitride, silicon nitride, zirconium nitride, silicon carbonitride, etc.), a silicon-containing material (e.g., hafnium silicide, silicon, zirconium silicide, etc.), other suitable materials, or combinations thereof. In the present embodiments, the composition of the ESL 244 is different from that of the ESL 242, the dielectric layer 232, and the gate spacers 212 to ensure sufficient etching selectivity between the said layers during subsequent processing steps. For embodiments in which the top portion of the ESL 242 remains in the device 200, e.g., the embodiment depicted in FIG. 14A, the ESL 244 is optional. The ILD layer 250 may be similar to the ILD layer 218 and may be formed in a process similar to that of forming the ILD layer 218 as discussed above. Subsequently, the method 100 forms a patterned masking element 260 over the device 200, such that a portion of the device 200 is exposed by a trench 262 formed in the patterned masking element 260. For example, portions of the ILD layer 250, the ESL 244 (and/or the ESL 242), and the dielectric layer 232 are removed using the patterned masking element 260 as an etch mask to form the trench 262 that exposes at least a portion of the HKMG structure 210. The patterned masking element 260 may include a resist material (e.g., a photoresist material) formed and patterned by a series of deposition and lithography processes similar to those discussed in detail above. Thereafter, the patterned masking element 260 is removed from the device 200 using a suitable method such as plasma ashing or resist stripping.

Figure 15B:
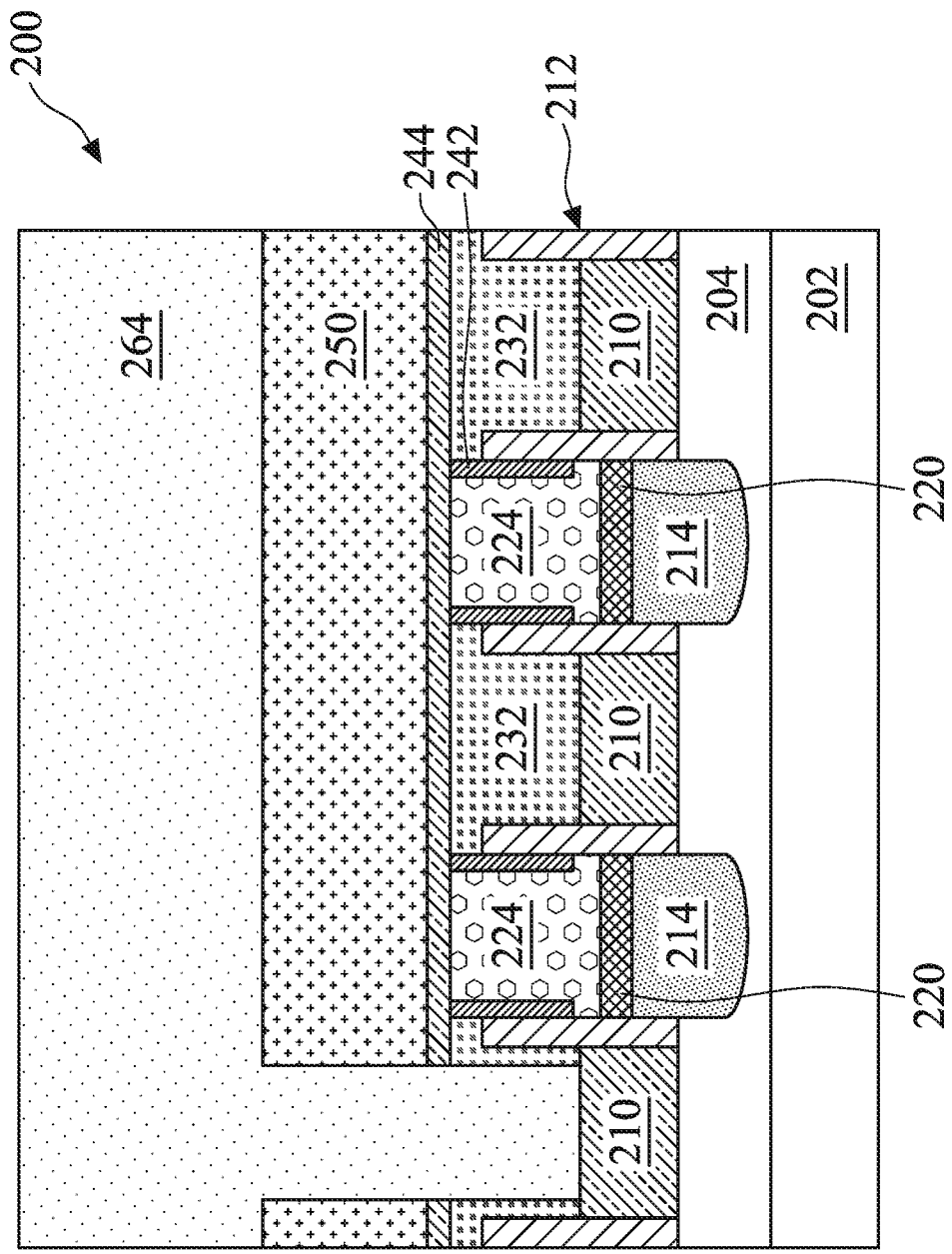
Figure 15C:
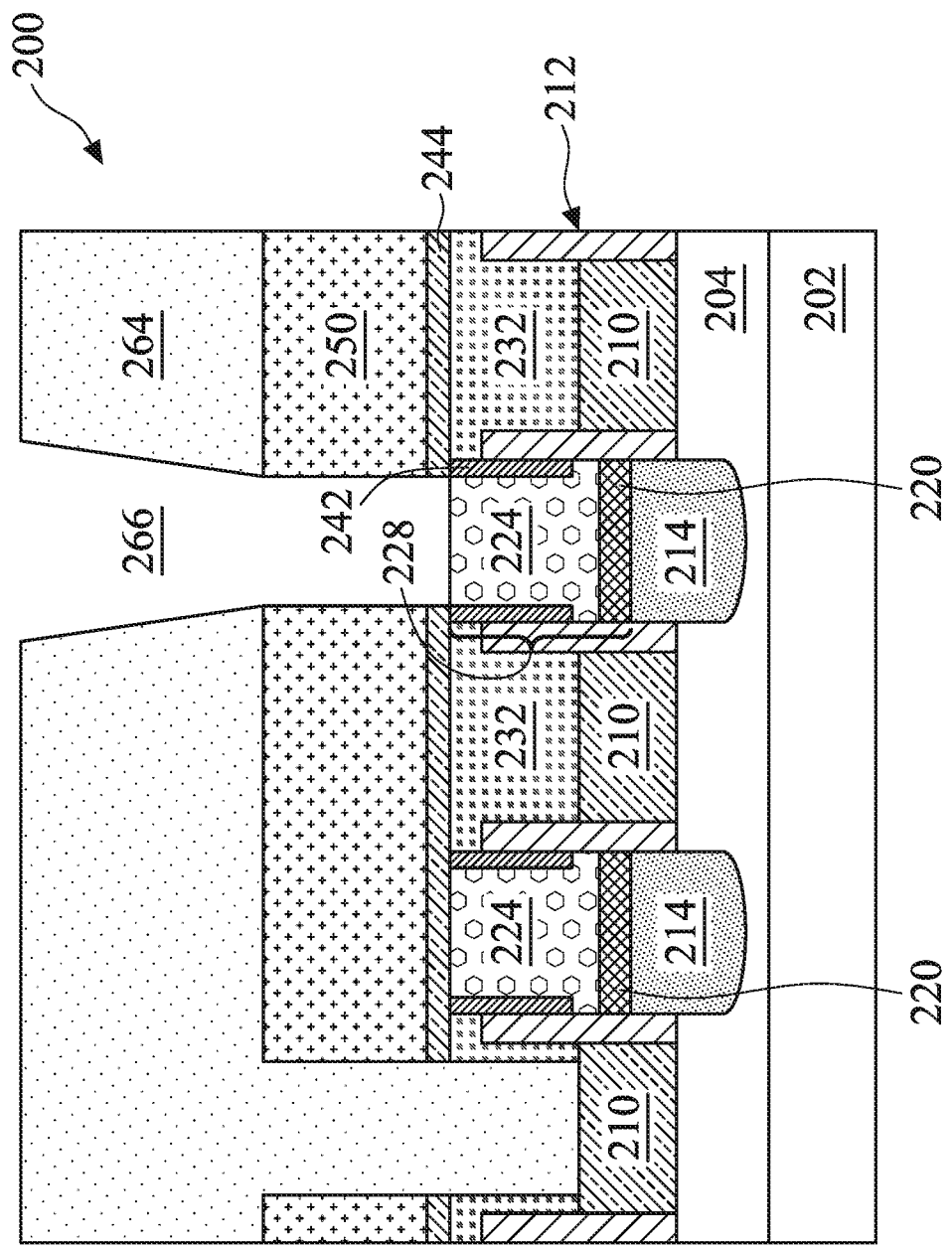
Figure 15D:
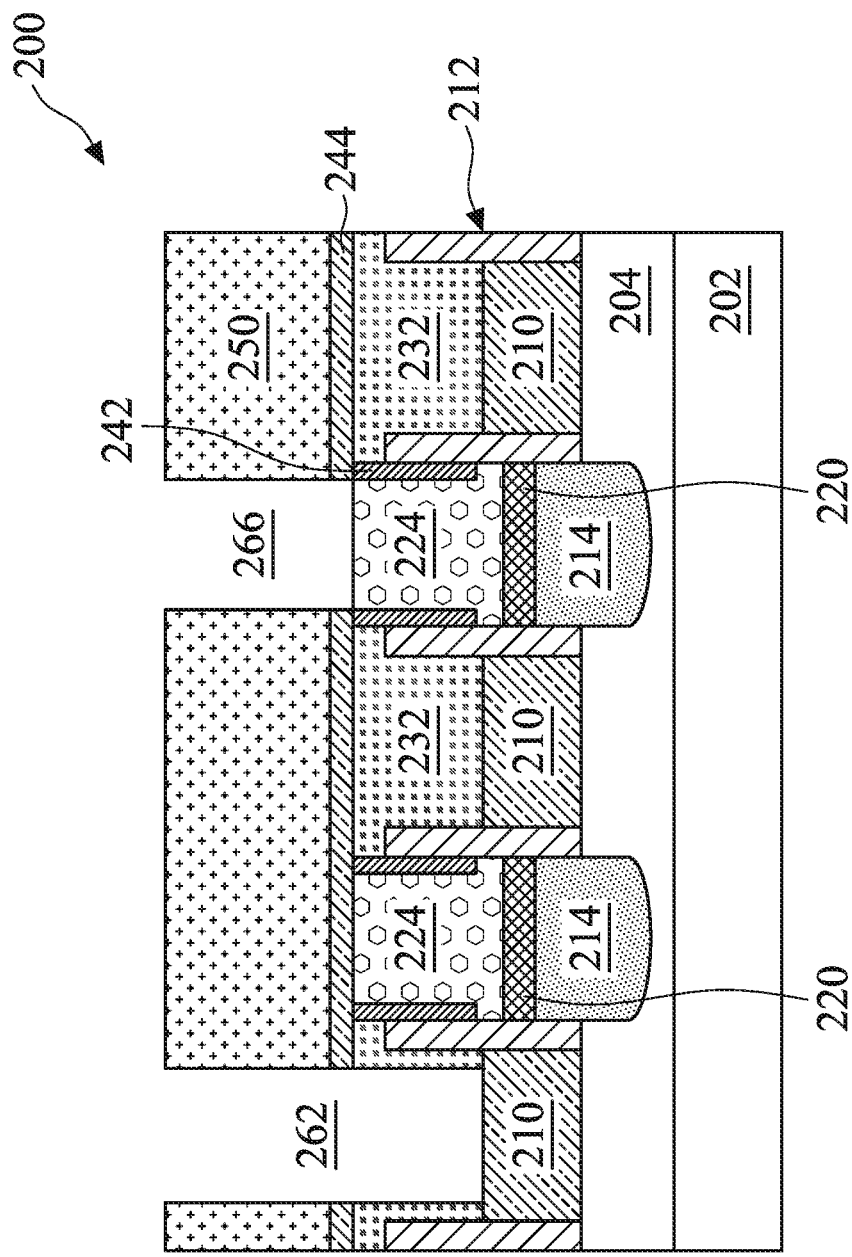

Now referring to FIGS. 15B-15C, the method 100 proceeds to form a masking element 264 over the ILD layer 250, thereby filling the trench 262. The masking element 264 may be substantially similar to the masking element 260 and may be formed in a series of deposition and lithography processes as discussed in detail above. Referring to FIG. 15C, the masking element 264 is patterned to expose at least a portion of the S/D contact 228 in a trench 266. The method then 100 proceeds to remove portions of the ILD layer 250 and the ESL 244 (and/or the ESL 242) using the patterned masking element 264 as an etch mask. Referring to FIG. 15D, the method 100 subsequently removes the patterned masking element 264 to re-open the trench 262 using any suitable method such as plasma ashing or resist stripping. Due to the processing limitation of the lithography patterning system at reduced length scales, it may not be feasible to pattern both of the trenches 262 and 266 in a one lithographical process, i.e., forming and patterning a single masking element that includes openings for both the trenches 262 and 266. It is noted, however, that the present disclosure does not limit the order in which the trenches 262 and 266 are formed, and in some embodiments, the formation of the trench 266 is optional.

Figure 16A:
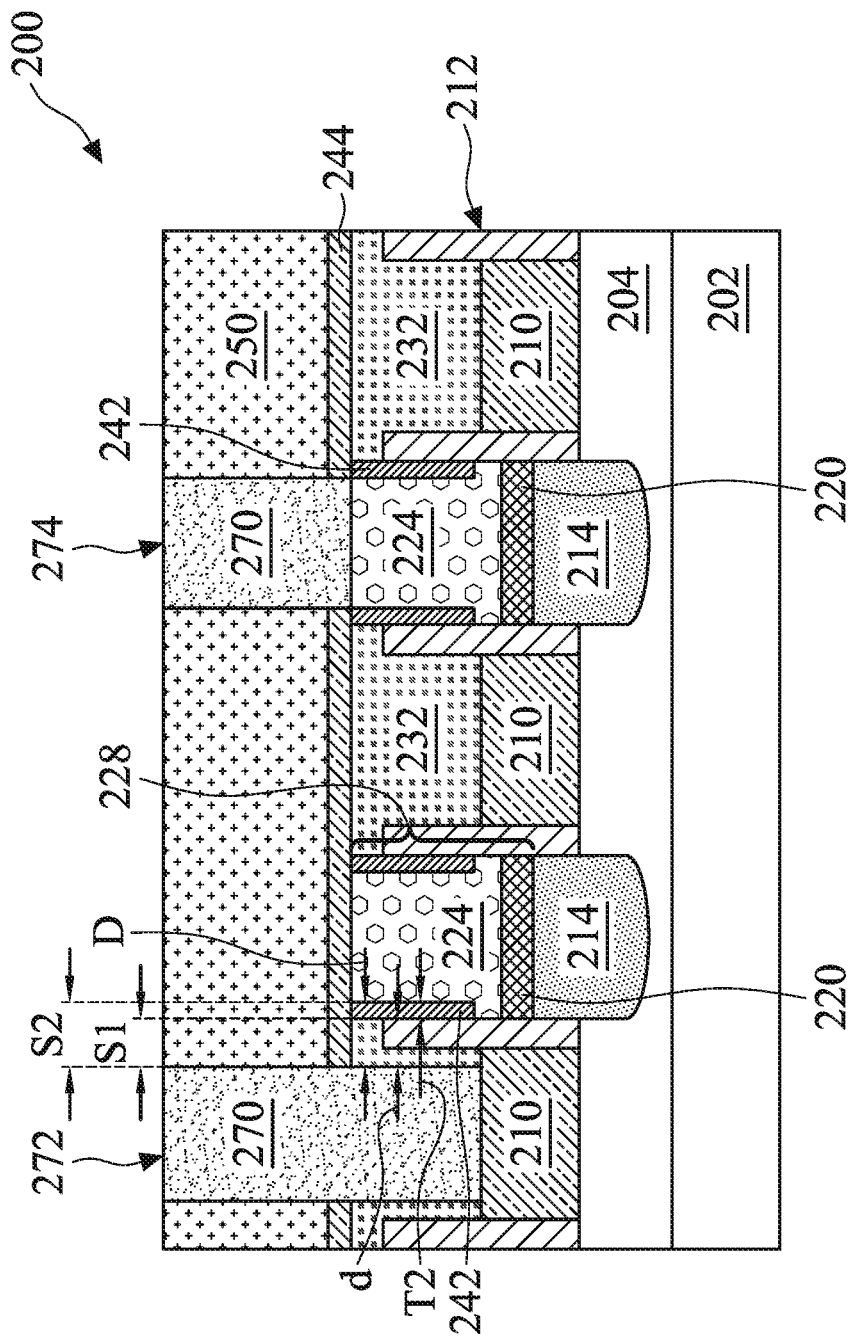
Figure 16B:
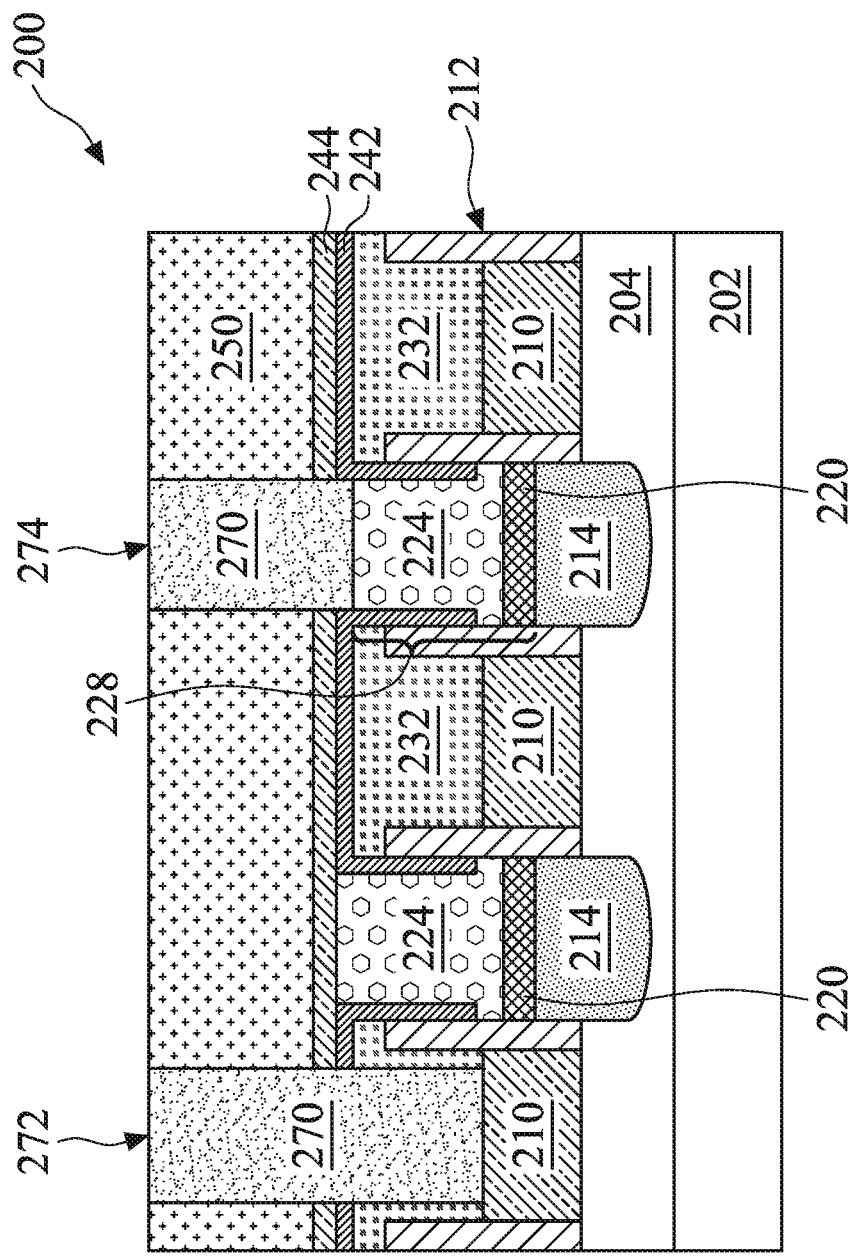
Figure 16C:
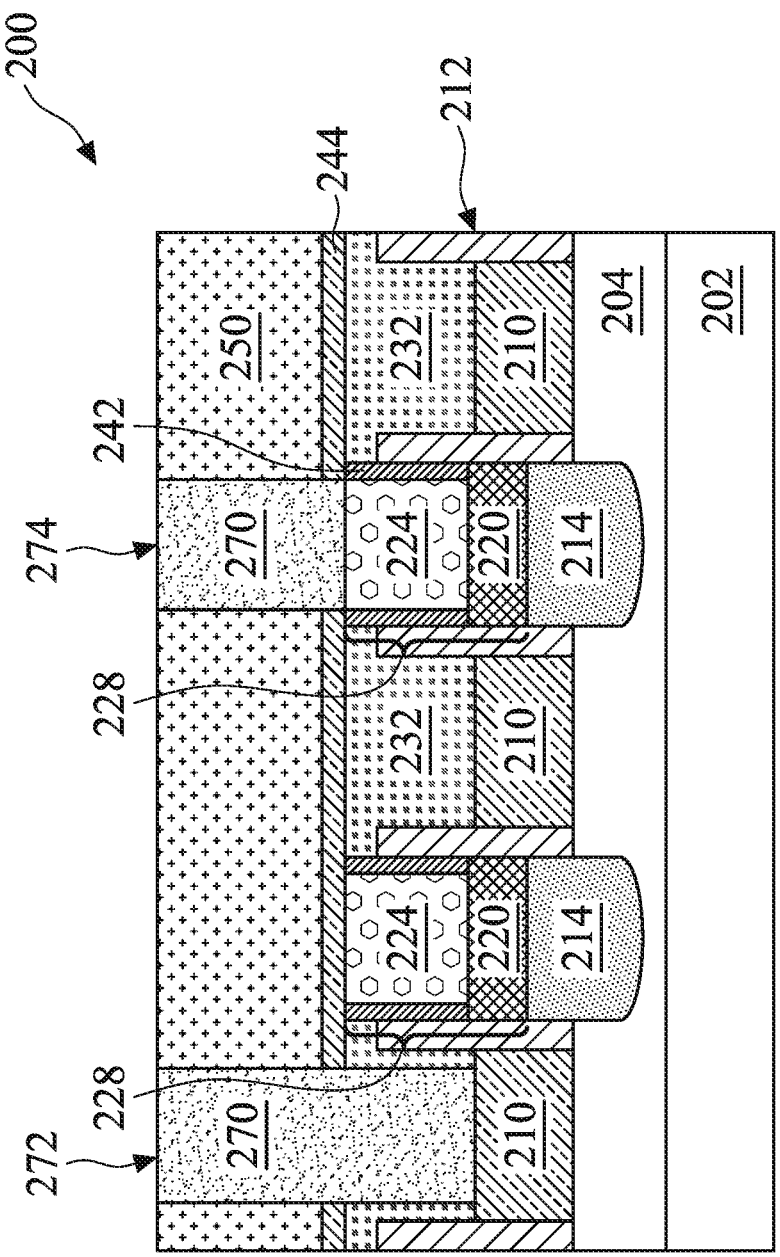

Now referring to FIGS. 16A-16C, the method 100 proceeds to form the gate contact 272 and the via contact 274 by filling the trenches 262 and 266, respectively, with a conductive material 270. The conductive material 270 may include any suitable material, such as W, Co, Ru, Cu, Ta, Ti, Al, Mo, other suitable conductive materials, or combinations thereof, and may be deposited by any suitable method, such as CVD, PVD, ALD, plating, other suitable methods, or combinations thereof. In some embodiments, the conductive material 270 includes a single material in direct contact with the ILD layer 250. In some embodiments, the conductive material 270 includes multiple layers. The conductive material 270 may be similar to the conductive layer 220 and/or 224 according to some embodiments. The method 100 may subsequently perform a CMP process to planarize the device 200 and remove any excess conductive material 270 formed over the ILD layer 250.

In the present embodiments, the gate contact 272 and the via contact 274 are configured to interconnect the HKMG structure 210 and the S/D contact 228 to their respective back-end-of-line (BEOL) features (e.g., vias, conductive lines, etc.). In some embodiments, referring to FIG. 16A, the gate contact 272 extends through the ILD layer 250, the dielectric layer 232, and the ESL 244 to contact the HKMG structure 210. In some embodiments, referring to FIG. 16B, the gate contact 272 extends through the ILD layer 250, the ESL 244, the ESL 242, and the dielectric layer 232 to contact the HKMG structure 210. In some embodiments, referring to FIG. 16C, the sidewalls of the bottom portions of the ESL 242 are in contact with the conductive layer 220 of the S/D contact 228.

Notably, using the depicted embodiment in FIG. 16A as an example, a separation distance D between the gate contact 272 and the S/D contact 228 includes the thickness T2 of the bottom portion of the ESL 242. In other words, the separation distance between the gate contact 272 and the S/D contact 228 is enlarged by the thickness T2 of the bottom portions of the ESL 242 (i.e., increasing from a separation distance d to the separation distance D). While the gate contact 272 is generally formed to land on the HKMG structure 210 after implementing the lithography process at operation 118, unintentional errors (e.g., overlay error of the lithography mask, processing variations of the lithography system, etc.) may cause the gate contact 272 to shift laterally toward a neighboring S/D contact 228. In some embodiments, effects of such errors are exacerbated at smaller length scales. Referring to FIG. 16A, for example, in the absence of the ESL 242, such a shift may be generally tolerated within an isolation window S1 before potential shorting between the gate contact 272 and the S/D contact 228 occurs. In the present embodiments, the presence of the ESL 242 enlarges the isolation window from S1 to S2, thereby providing greater margin for allowing any inadvertent errors when forming the gate contact 272.

Thereafter, referring back to FIG. 1, the method 100 at operation 120 performs additional processing steps to the device 200. For example, the method 100 may proceed to form an ESL over the device 200 and an ILD layer over the ESL in order to accommodate subsequent formation of additional BEOL features such as conductive lines and/or vias.

The present disclosure provides a method of forming a gate contact over an HKMG, which is disposed adjacent to an S/D contact in a semiconductor device (e.g., an FET). In an example embodiment, after forming a first metal layer (as a part of the S/D contact) over an S/D feature, the first metal layer is partially removed to form a trench, and an ESL is subsequently deposited on sidewalls of the trench. In the present embodiments, the ESL is selectively deposited over dielectric features (e.g., gate spacers) but not or not substantially over the first metal layer. In some embodiments, a top portion of the first metal layer is removed by a series of oxidation and etching processes, such that the trench is extended vertically and laterally below the ESL. Afterwards, a second metal layer is formed over the first metal layer in the trench, such that sidewalls of the second metal layer are defined by the ESL. The second metal layer may include different metal(s) from the first metal layer. In some embodiments, the second metal layer includes a metal configured to be selectively deposited over the first metal layer. Thereafter, portions of the second metal layer formed over the HKMG are removed by a CMP process, thereby forming the S/D contact. In some embodiments, a top portion of the S/D contact that includes the second metal layer is narrower in width than a bottom portion of the S/D contact that includes the first metal layer. An ILD layer is then formed over the S/D contact (including the first and the second metal layers) and a gate contact is formed in the ILD layer and extends to contact the HKMG. In some embodiments, the gate contact is separated from the S/D contact by at least a thickness of the ESL formed between the gate spacers and the sidewall of the second metal layer.

Based on the above discussions, it can be seen that the present disclosure offers advantages over conventional FinFET fabrication. It is understood, however, that other embodiments may offer additional advantages, that not all advantages are necessarily disclosed herein, and that no particular advantage is required for all embodiments. In one example, an embodiment of the present disclosure provides increased isolation window between neighboring gate contact and S/D contact as a result of a dielectric ESL inserted between the S/D contact and gate spacers, thereby enlarging the processing window for patterning and forming the gate contact with reduced feature size. In another example, an embodiment of the present disclosure forms an S/D contact in a series of deposition and etching processes, allowing conductive materials with different properties to be included for enhanced processability and/or device performance.

In one aspect, the present disclosure provides a semiconductor structure that includes a metal gate structure (MG) disposed over a semiconductor substrate, a gate spacer disposed on a sidewall of the MG, and a gate contact disposed on the MG. The semiconductor structure further includes a source/drain (S/D) feature disposed adjacent to the gate spacer, a dielectric layer disposed on a sidewall of the gate spacer, and an S/D contact disposed on the S/D feature. In particular, the S/D contact includes a first metal layer disposed on the S/D feature and a second metal layer disposed on the first metal layer, where a sidewall of the first metal layer is in contact with the gate spacer and a sidewall of the second metal layer is separated from the gate spacer by the dielectric layer.

In another aspect, the present disclosure provides a semiconductor structure that includes a metal gate structure (MG) disposed over a semiconductor substrate, gate spacers disposed on sidewalls of the MG, and a gate contact disposed on the MG. The semiconductor structure further includes an etch-stop layer (ESL) disposed on the gate spacers, and a source/drain (S/D) contact disposed adjacent to the gate spacers, where a top portion of the S/D contact defined by the ESL is narrower than a bottom portion of the S/D contact defined by the gate spacers.

In yet another aspect, the present disclosure provides a method of forming a semiconductor device that includes providing a semiconductor structure having a metal gate structure (MG), gate spacers disposed on sidewalls of the MG, and a source/drain (S/D) feature disposed adjacent to the gate spacers, forming a first metal layer over the S/D feature and between the gate spacers, and recessing the first metal layer to form a trench. The method further includes forming a dielectric layer on sidewalls of the trench and forming a second metal layer over the first metal layer in the trench, where sidewalls of the second metal layer are defined by the dielectric layer. The method further includes forming an interlayer dielectric (ILD) layer over the second metal layer and subsequently forming a contact feature in the ILD layer to contact the MG.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a metal gate structure (MG) disposed over a semiconductor substrate;
    a gate spacer disposed on a sidewall of the MG;
    a gate contact disposed on the MG;
    a source/drain (S/D) feature disposed adjacent to the gate spacer;
    a dielectric layer disposed on a sidewall of the gate spacer; and
    an S/D contact disposed on the S/D feature, wherein the S/D contact includes a first metal layer disposed on the S/D feature and a second metal layer disposed on the first metal layer, wherein a sidewall of the first metal layer is in contact with the gate spacer, and wherein a sidewall of the second metal layer is separated from the gate spacer by the dielectric layer; and
    an etch-stop layer (ESL) disposed on the dielectric layer and the second metal layer, wherein the ESL is in direct contact with a top surface of the dielectric layer and a top surface of the second metal layer.

2. The semiconductor structure of claim 1, wherein the first metal layer includes a first metal, and wherein the second metal layer includes a second metal different from the first metal.

3. The semiconductor structure of claim 2, wherein the second metal layer includes W, Ru, Co, or combinations thereof.

4. The semiconductor structure of claim 1, wherein the gate spacer includes a first dielectric material, and wherein the dielectric layer includes a second dielectric material different from the first dielectric material.

5. The semiconductor structure of claim 1, wherein a bottom surface of the dielectric layer is separated from a top surface of the first metal layer by a portion of the second metal layer.

6. A semiconductor structure, comprising:
    a metal gate structure (MG) disposed over a semiconductor substrate;
    gate spacers disposed on sidewalls of the MG and comprising a first sidewall in direct contact with the MG and a second sidewall opposing the first sidewall;
    a gate contact disposed on the MG;

an etch-stop layer (ESL) disposed on the gate spacers and in direct contact with the second sidewall of the gate spacers; and a source/drain (S/D) contact disposed adjacent to the gate spacers, wherein the S/D contact comprises a barrier layer, a first conductive layer, and a second conductive layer over the first conductive layer and the barrier layer, wherein a width of a top portion of the second conductive layer interfacing with the ESL is less than a width of a bottom portion of the second conductive layer defined by the gate spacers, wherein the first conductive layer is free of contact with the ESL, and wherein the first conductive layer and the second conductive layer have different compositions.

7. The semiconductor structure of claim 6, further comprising a dielectric layer disposed on the MG, such that the gate contact extends through the dielectric layer to contact the MG, wherein a portion of the dielectric layer separates the MG from the ESL.

8. The semiconductor structure of claim 7, wherein portions of the ESL are disposed over an upper surface of the dielectric layer.

9. The semiconductor structure of claim 7, wherein the dielectric layer extends over a top surface of the gate spacers, and wherein the top surface of the gate spacers is lower than a top surface of the ESL.

10. The semiconductor structure of claim 6, wherein the ESL is a first ESL, the semiconductor structure further comprising a second ESL disposed over a top surface of the first ESL.

11. The semiconductor structure of claim 6, wherein the second conductive layer is free of Cu.

12. A semiconductor structure, comprising:
a gate structure (MG) disposed over a semiconductor layer;
a source/drain (S/D) feature disposed adjacent to the MG;
a contact feature (MD) disposed over the S/D feature;
a gate spacer separating the MG from the MD;
a first dielectric layer disposed along and in direct contact with a first sidewall of the gate spacer to define a sidewall of an upper portion of the MD, wherein a sidewall of a lower portion of the MD below the upper portion is free of contact with the first dielectric layer, and wherein a topmost portion of the sidewall of the upper portion of the MD is in direct contact with the first dielectric layer; and a second dielectric layer extending over and in direct contact with a top surface and along a second sidewall of the gate spacer to directly contact the MG, the second sidewall being opposite to the first sidewall, wherein a top surface of the first dielectric layer is coplanar or higher than a top surface of the second dielectric layer.

13. The semiconductor structure of claim 12, wherein the upper portion of the MD extends to below a bottom surface of the first dielectric layer, thereby separating the first dielectric layer from the lower portion of the MD.

14. The semiconductor structure of claim 12, wherein a bottom surface of the first dielectric layer directly contacts a top surface of the lower portion of the MD.

15. The semiconductor structure of claim 12, wherein a portion of the first dielectric layer is disposed over a top surface of the MG.

16. The semiconductor structure of claim 12, further comprising a gate contact electrically coupled to the MG, wherein the gate contact is laterally separated from the MD by the gate spacer and the first dielectric layer.

17. The semiconductor structure of claim 12, wherein the first dielectric layer vertically protrudes from the gate spacer.

18. The semiconductor structure of claim 12, wherein the upper portion of the MD includes a first metal, and wherein the lower portion of the MD includes a second metal different from the first metal.

19. The semiconductor structure of claim 12, wherein a portion of the second dielectric layer extends over the gate spacer to directly contact the first dielectric layer.

20. The semiconductor structure of claim 19, wherein a portion of the first dielectric layer directly contacts the top surface of the second dielectric layer.

* * * * *